United States Patent [19]
Yamana et al.

[11] Patent Number: 5,418,384
[45] Date of Patent: May 23, 1995

[54] LIGHT-SOURCE DEVICE INCLUDING A LINEAR ARRAY OF LEDS

[75] Inventors: Shinji Yamana, Yamatokoriyama; Terukazu Ohtsuki, Ikoma, both of Japan

[73] Assignee: Sharp Kabushiki Kaisha, Osaka, Japan

[21] Appl. No.: 26,841

[22] Filed: Mar. 5, 1993

[30] Foreign Application Priority Data

Mar. 11, 1992 [JP] Japan .................................. 4-052686
Aug. 28, 1992 [JP] Japan .................................. 4-230451

[51] Int. Cl.[6] .................. H01L 33/00; H01L 27/14; H01L 31/00
[52] U.S. Cl. .................................... 257/88; 257/98; 257/443; 362/800; 355/228
[58] Field of Search .................. 257/98, 81, 91, 432, 257/433, 79, 723, 88, 98, 443; 385/33; 362/800, 31, 249, 328; 355/228, 229

[56] References Cited

U.S. PATENT DOCUMENTS

| | | | |
|---|---|---|---|
| 3,883,772 | 5/1975 | Wako et al. | 313/499 |
| 4,703,337 | 10/1987 | Yamazaki | 357/30 |
| 4,929,866 | 5/1990 | Murata et al. | 313/500 |
| 4,947,300 | 8/1990 | Wen | 362/183 |
| 4,954,931 | 9/1990 | Hassler, Jr. | 362/800 |
| 5,017,986 | 5/1991 | Rouse | 357/30 |
| 5,050,946 | 9/1991 | Hathaway et al. | 385/33 |
| 5,070,431 | 12/1991 | Kitazawa et al. | 362/800 |
| 5,237,641 | 8/1993 | Jacobson et al. | 385/146 |

FOREIGN PATENT DOCUMENTS

| | | | |
|---|---|---|---|
| 0027269 | 4/1981 | European Pat. Off. | |
| 3123369 | 2/1983 | Germany | |
| 52-47692 | 4/1977 | Japan | |
| 58-222578 | 12/1983 | Japan | 257/98 |
| 61-084880 | 4/1986 | Japan | 257/98 |
| 62-235787 | 10/1987 | Japan | 257/98 |
| 64-13167 | 1/1989 | Japan | |
| 64-13743 | 1/1989 | Japan | |

OTHER PUBLICATIONS

EPO Search Report.
IBM TDB vol. 31 No. 12, May 1989, High performance Quantum Well GaAs Distribbuted Feedback and Reflector Structures, pp. 172–173.

*Primary Examiner*—Robert P. Limanek
*Assistant Examiner*—Teresa M. Arroyo
*Attorney, Agent, or Firm*—Nixon & Vanderhye

[57] ABSTRACT

A light-source device includes a light source and a light-pervious flat board, the light source being optically connected to one side of the flat board for introduction of light into the flat board so that the incoming light is caused to be reflected from other side of the flat board therewithin for being directed outward from the flat board, the light reflecting side of the flat board being indented to provide a surface having a serrated sectional configuration.

20 Claims, 19 Drawing Sheets

FIG.26
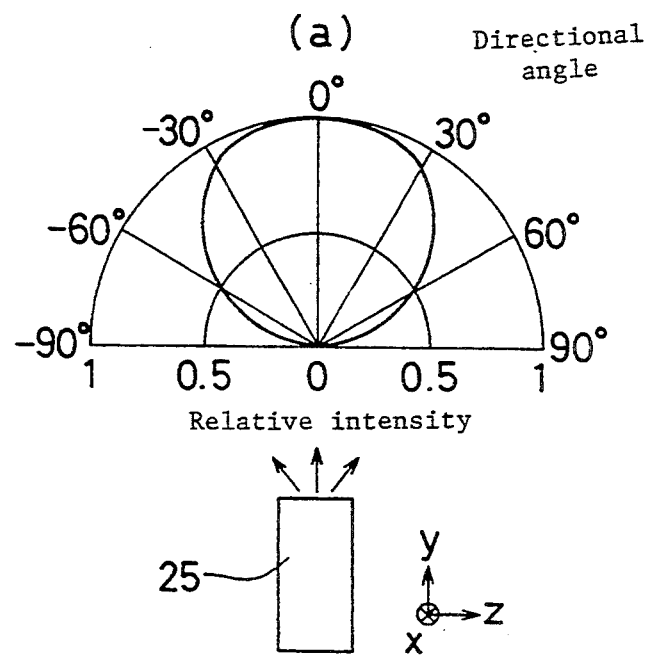
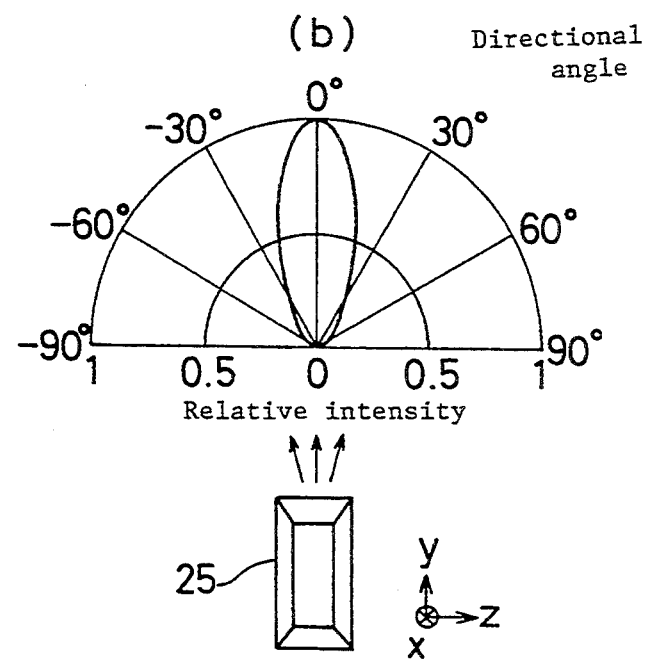

LIGHT-SOURCE DEVICE INCLUDING A LINEAR ARRAY OF LEDS

BACKGROUND OF THE INVENTION

1. Field of the Invention

The present invention relates to a light-source device for illuminating linear fields which is mainly intended for use in illuminating documents to be read by facsimile, image scanner, bar code reader or the like means, as well as for use in destaticizing the photo-receptor drum of a copying machine, a printer or the like.

2. Description of the Prior Art

Hitherto, light-source devices of this kind have been known such that light-emitting diodes are arranged in a row on a circuit board (see, for example, Japanese Published Unexamined Patent Application No. 47692/1977).

With such known light-source device, however, the problem is that light beams produced from the light source are not sufficiently utilized in an effective manner in illuminating linear fields.

SUMMARY OF THE INVENTION

In accordance with the invention there is provided a light source device comprising a light source and a light-pervious flat board, the light source being optically connected to one side of the flat board for introduction of light into the flat board so that the incoming light is caused to be reflected from the other side of the flat board and outward from the flat board, the light reflecting side of the flat board being indented to provide a surface having a serrated sectional configuration.

The light source for the light source device may comprise a substrate having a recess formed in the surface thereof, light-emitting diodes arranged on the bottom of the recess, and a conductive reflective film formed on the surface of the recess, the light-emitting diodes being electrically connected to an external power source via the conductive reflective film.

The conductive reflective film may be divided into two segments, the anodes and cathodes of the diodes being connected to the external power source via one of the segments and the other segment, respectively.

The surface serrated for the light source device in sectional configuration may be made larger in area in proportion as the surface is more distant from the light source.

BRIEF DESCRIPTION OF THE DRAWINGS

FIG. 26 is an explanatory view showing optical directional characteristics of the light-source device, with (a) for Embodiment 3 and (b) for Embodiment 4.

DETAILED DESCRIPTION OF THE PREFERRED EMBODIMENTS

Embodiments of the invention will now be described in detail with reference to the drawings. It is not intended that the invention is limited by the embodiments.

EMBODIMENT 1

Figure 1:
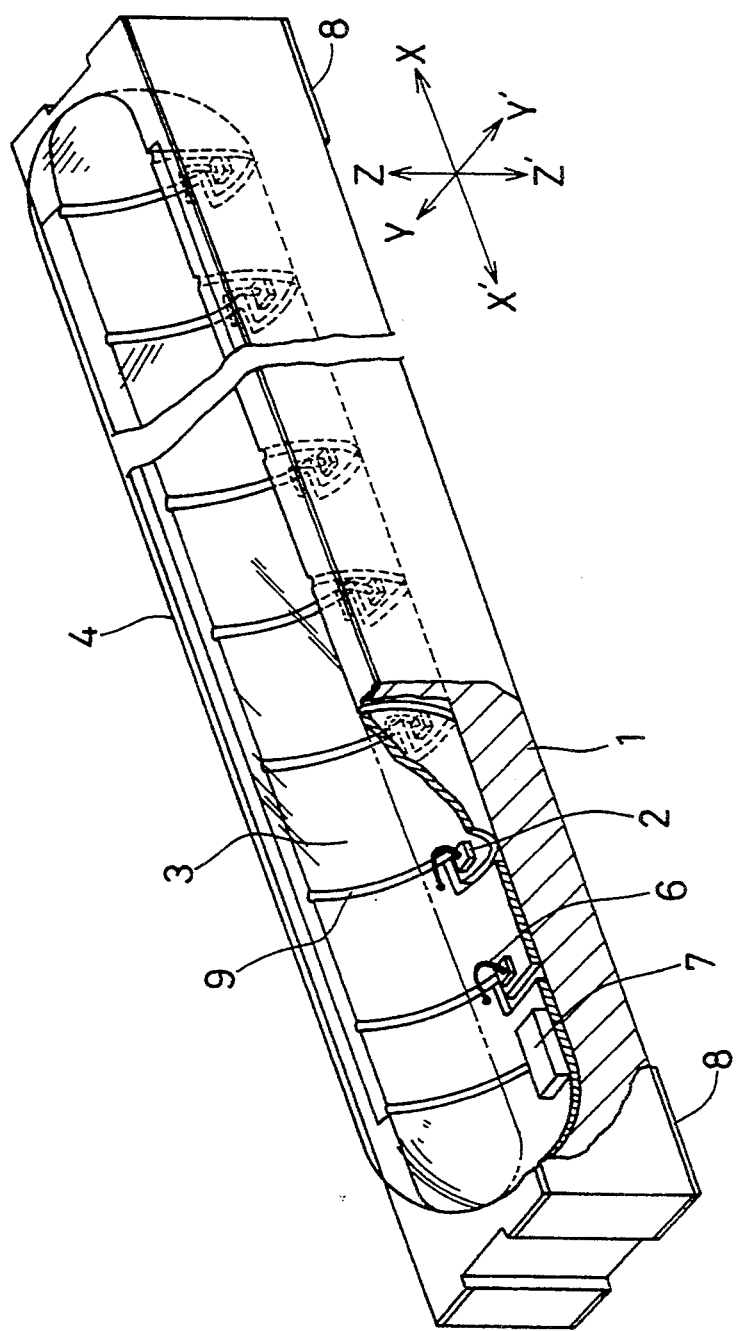
FIG. 1 is a perspective view of Embodiment 1 of the present invention.
Figure 2:
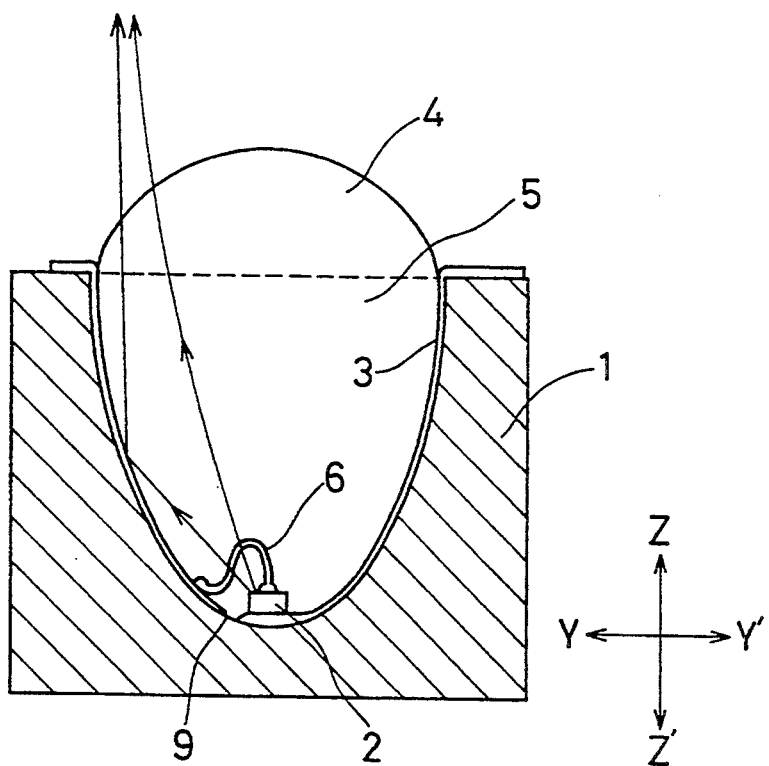
FIG. 2 is a section taken in the direction of Y—Y' in FIG. 1.
Figure 3:
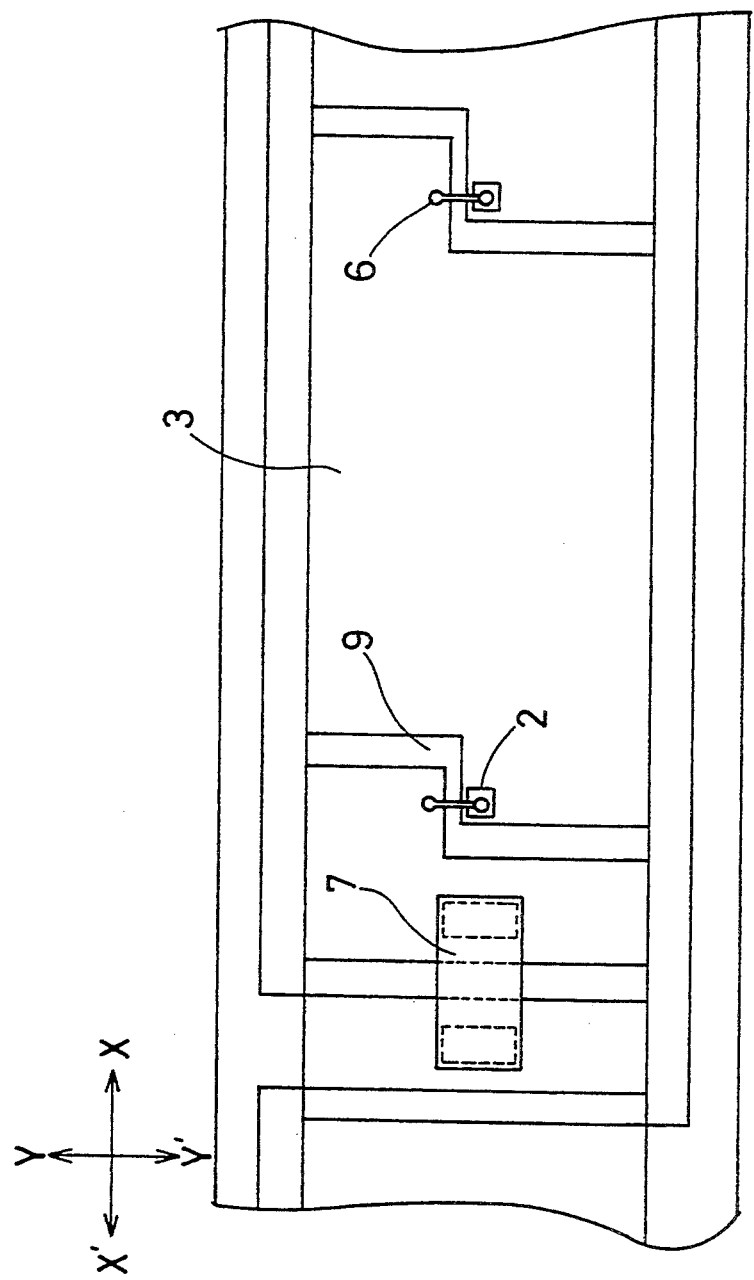
FIG. 3 is a view for explaining the wiring pattern in Embodiment 1.
Figure 4:
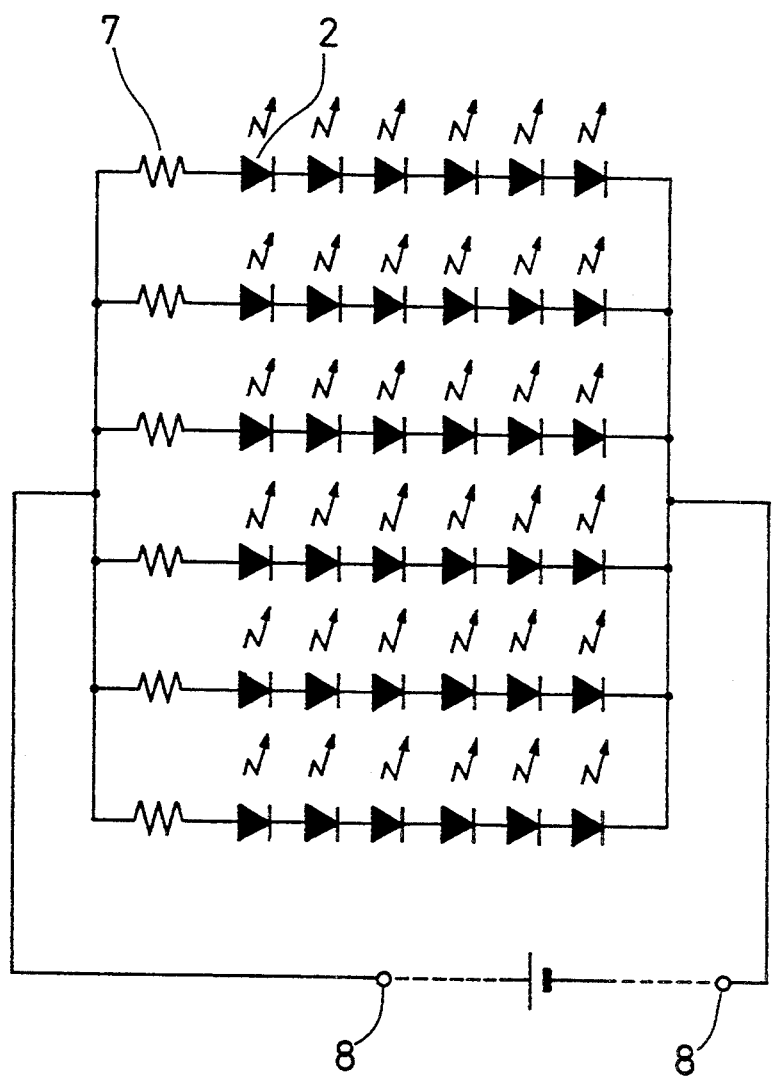
FIG. 4 is a circuit diagram showing electrical connections in Embodiment 1.
Figure 5:
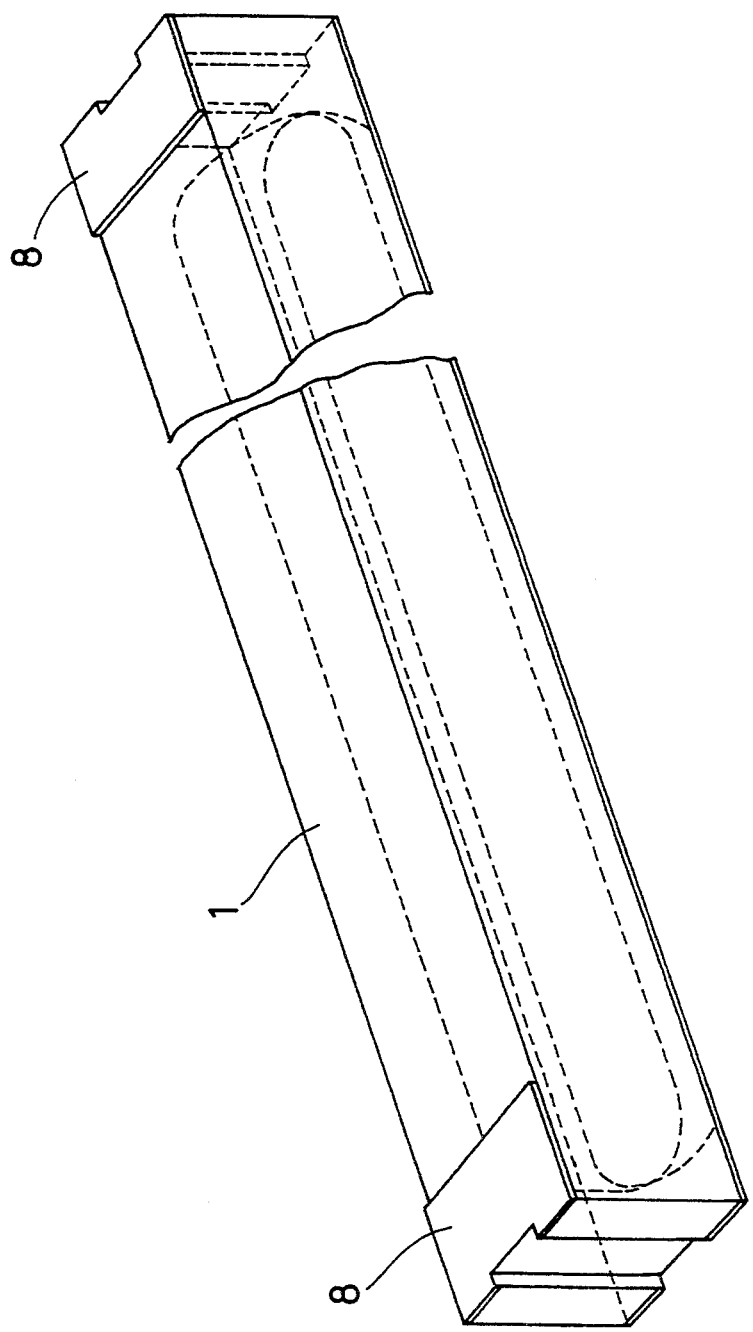
FIG. 5 is a perspective view of Embodiment 1 arrangement as seen from the back side thereof.

FIG. 1 is a perspective view showing schematically the light source of Embodiment 1 of the present invention; FIG. 2 is a section taken in the direction of Y—Y' in FIG. 1; and FIG. 3 is a detail view of a part of the wiring pattern formed on the substrate (a plan view taken from the direction of light emission). FIG. 4 shows electrical wire connection in the present embodiment. FIG. 5 schematically shows the construction of the embodiment at a side opposite to the direction of light emission (or the back side of the substrate).

As FIGS. 1 through 3 illustrate, on the surface of a light-shieldable resin substrate 1 formed with a ditch-like recess and having a length of 270 mm (in X—X' direction), a width of 5 mm (in Y—Y' direction) and a thickness of 5 mm (in Z—Z' direction) there is laid a conductive metal film 3 formed by aluminum vapor deposition, electroless gold plating or the like technique. The metal film is partially removed by photo-etching or the like technique, with electric insulation zones 9 formed thereby, to provide an electric wiring pattern.

The substrate 1 is fabricated by injection molding from a heat-resistant resin, such as liquid crystal polymer. On the bottom of the groove of the substrate 1 are packaged 36 GaP light-emitting diode chips 2 (with a light emission wavelength of 565 nm) in a row (in X—X' direction) and at equispaced intervals of 7.2 mm pitch. Each light-emitting diode chip 2 is fixed by silver paste to the substrate 1 on a cathode connecting land formed at the bottom of the substrate integrally with the wiring pattern, which fixing is effected simultaneously as the cathode is die-bonded and electrically connected to the wiring pattern 3 on the substrate.

The anode of each light-emitting diode chip 2 is electrically connected to an anode connecting land formed on the substrate, by being wire-bonded by gold wire 6 to the land. The concave portion of the ditch formed on the substrate presents a parabolic surface as viewed in the Y—Y' direction, and a larger part of the surface is formed with a metal film 3 constituting a part of the wiring pattern which acts as a reflector having a function to reflect frontward light beams emitted sideward from light-emitting diode chips (with a reflectance of about 0.8).

All the light-emitting diode chips 2 mounted at the bottom of the ditch of the substrate, gold wires 6 connecting the light-emitting diode chips 2 with the substrate1, concave-surfaced reflector metal film 3, load resistance elements 7 of the light-emitting diode chips 2 are integrally sealed by a light-pervious epoxy resin mass 5, and the surface portion of the resin forms a cylindrical lens having a concave portion 4 with respect to the direction of Y—Y'.

In order to minimize the decrease of illuminance (i.e., illuminance ripple in the X—X' direction) in a subject field in front of any position at which a light-emitting diode chip 2 is absent (or a gap between adjacent light-emitting diode chips), the light-pervious resin 5 used for sealing purposes contains $SiO_2$ (silica) powder that serves as a light scattering agent.

The metallic wiring pattern on the substrate 1, as shown in FIG. 4, is patterned in such a way that light-emitting diode chips in units of six are connected in series so that six sets of serial circuits thereof are connected in parallel. Each of the six sets of serial units has one load resistance element 7 connected thereto in series, and the resistance element 7 is surface-mounted by soldering on a load resistance connecting land provided in a space adjacent to the light-emitting diode chip 2.

The wiring pattern on the substrate, as shown in FIG. 5, is guided across the surface of the substrate until it reaches a side (underside) opposite to the side on which the substrate is recessed, and terminals 8 are provided on the underside of the substrate for electrical connection with an external power source.

Operation of the arrangement of Embodiment 1 will now be explained.

When an external power source is connected to an electric connection terminal 8 on the underside of the substrate 1, electric current flows via the wiring pattern on the substrate to all light-emitting diode chips 2 packaged on the substrate, and the light-emitting diode chips 2 emit light beams (with an emission wavelength of 565 nm).

Light rays emitted from each light-emitting diode chip 2 pass through the light-pervious resin 5 which seals the chips and gold wires 6, and some of the rays reach the surface 4 of the resin. Some of the light rays which have been emitted frontward of the light-emitting diode chip 2 and have reached the seal resin surface 4 are refracted at the convex resin surface, being then directed outward. In this case, because of the fact that the surface of the sealing resin 5 is configured to be a cylindrical lens having a convex lens function with respect to the Y—Y' direction, light rays which have passed through that surface portion are collected more closely along the optical axis of the lens with respect to the Y—Y' direction. Some of the light rays emitted laterally or in the Y—Y' direction from the light-emitting diode chip are reflected frontward from the metal film (reflector) 3 placed on the surface of the recessed portion of the substrate, then becoming incident on the cylindrical lens 4. Light rays passing through the cylindrical lens 4 are gathered in the Y—Y' direction before they reach a predetermined linear field which is an illumination subject.

Nextly, a modified form of this embodiment will be described.

Figure 6:
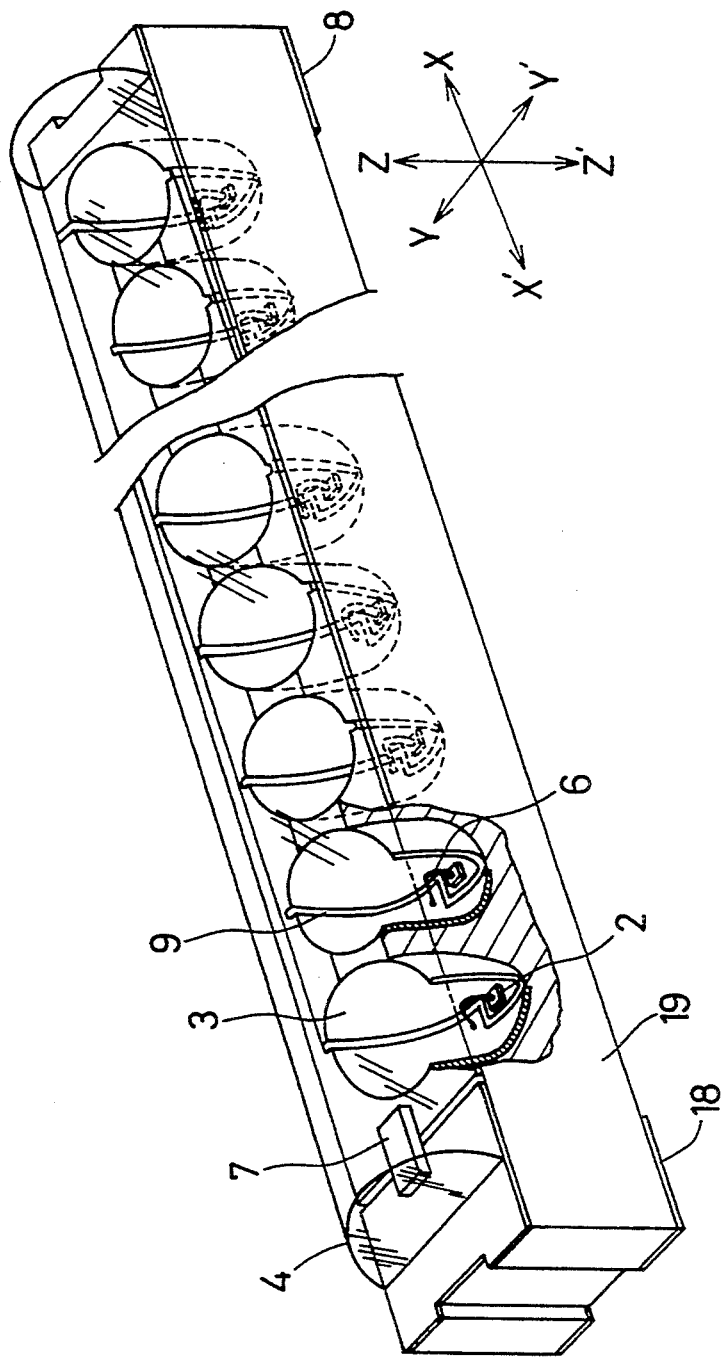
FIG. 6 is a perspective view showing a modified form of Embodiment 1.

As FIG. 6 illustrates, separate metal films (concave mirrors) 3 on which a chip-connecting gold wires 6 are mounted are provided for individual light-emitting diode chips 2, and the respective metal films 3 are of such modified arrangement that they function to reflect frontwardly light rays emitted laterally or in the X—X' direction with respect to the chips.

In this way, light rays emitted frontwardly of each light-emitting diode chip are collected by a cylindrical convex lens formed on the surface of a light-pervious resin which seals the chip, and light rays emitted sidewardly of the chip are reflected frontwardly by a convex mirror formed on the substrate integrally therewith. Therefore, light rays incident on the cylindrical lens within an effective range will increase, it being thus possible to achieve improved utilization of light.

Further, it is possible to obtain higher intensity of illumination with the same power consumption as in the past, and where the illuminance is held at the same level as in the past, the number of light-emitting diode chips required to be loaded can be curtailed which results in cost reduction, and drive current for the light-emitting diodes can be economically controlled, which results in prolonged life of chips, increased reliability, and reduced running cost.

Moreover, the light source is very compact in construction because of the use of a reflector-packaged wiring board, and this provides for equipment compacturization.

EMBODIMENT 2

Figure 7:
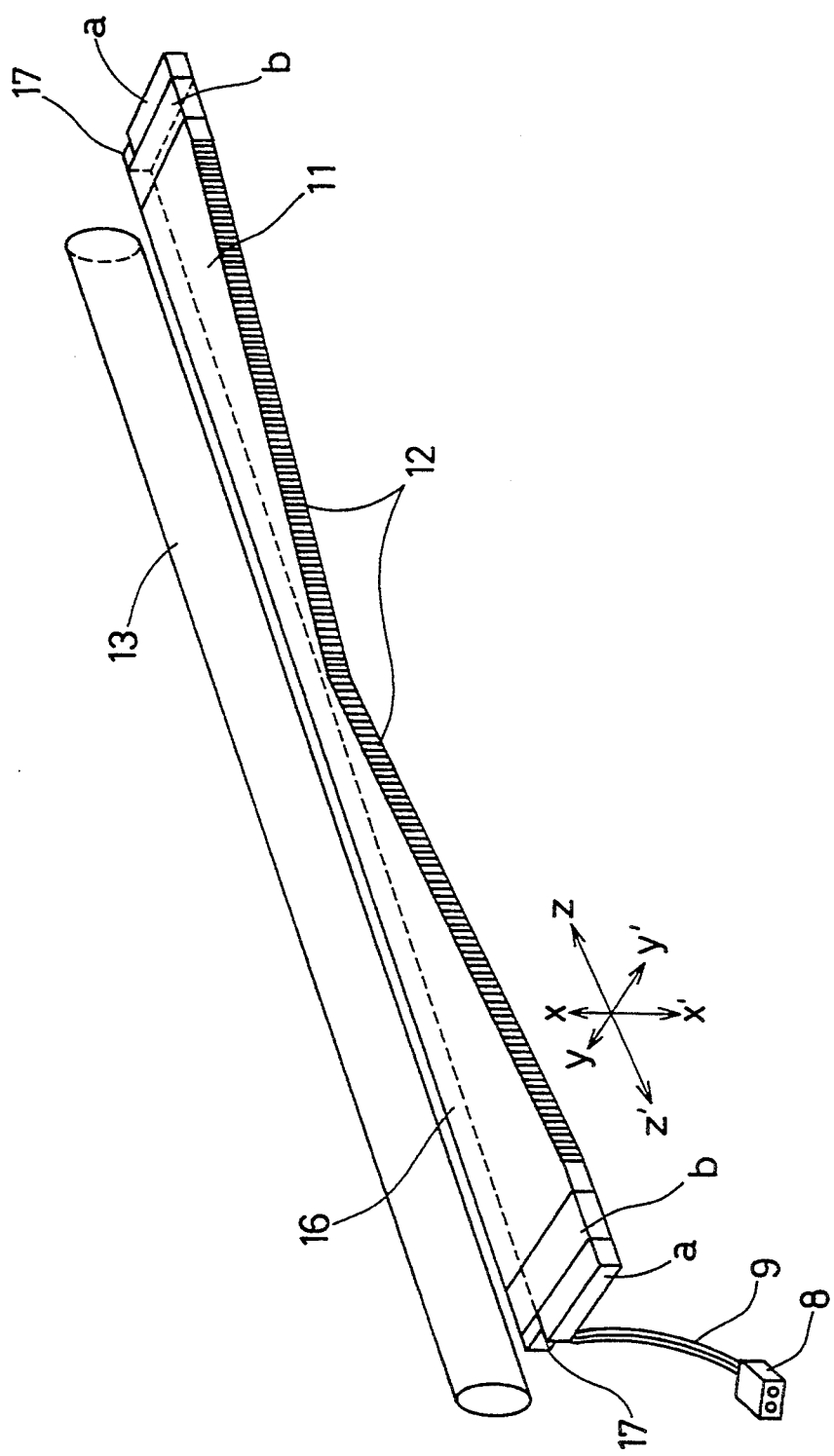
FIG. 7 is a perspective view showing Embodiment 2 of the invention.
Figure 8:
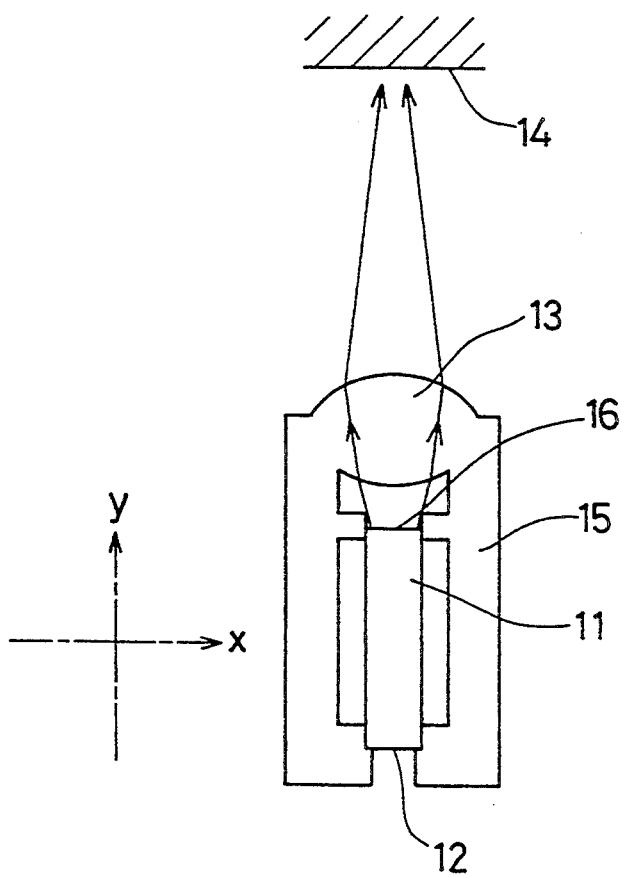
FIG. 8 is a section taken in the direction of Y—Y' in FIG. 7.

FIG. 7 is a perspective view of a light-source device representing Embodiment 2 of the present invention, and FIG. 8 is a section of the device taken in the direction of Y—Y'.

Figure 9:
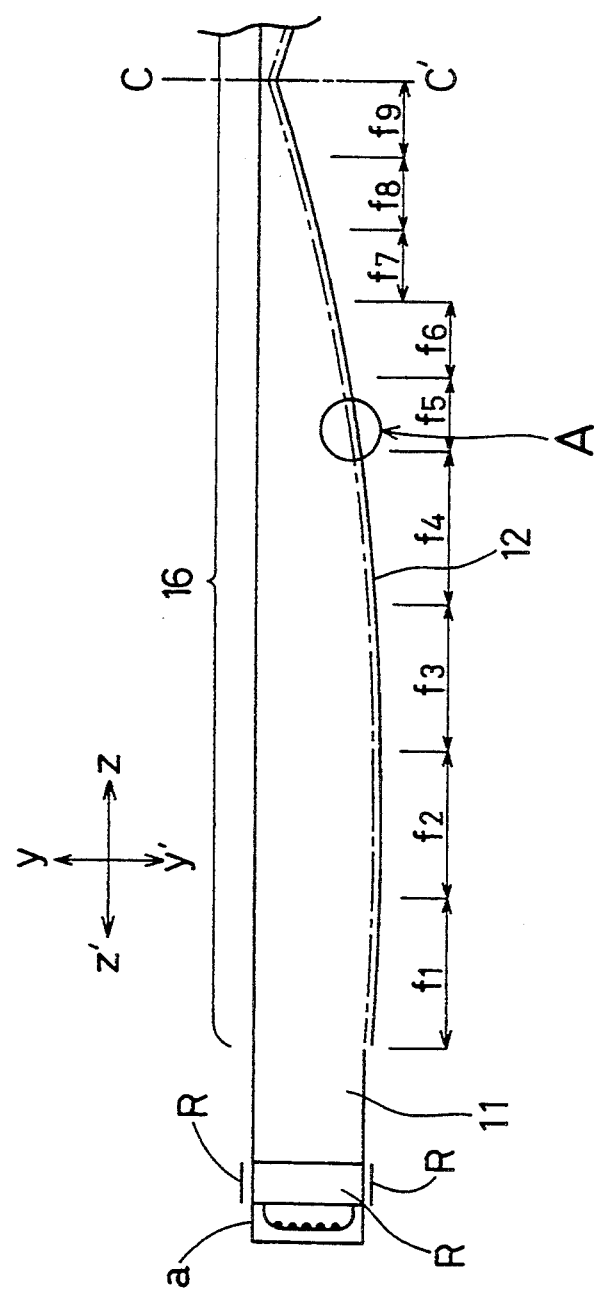
FIG. 9 is a fragmentary plan view of the embodiment shown in FIG. 7.
Figure 10:
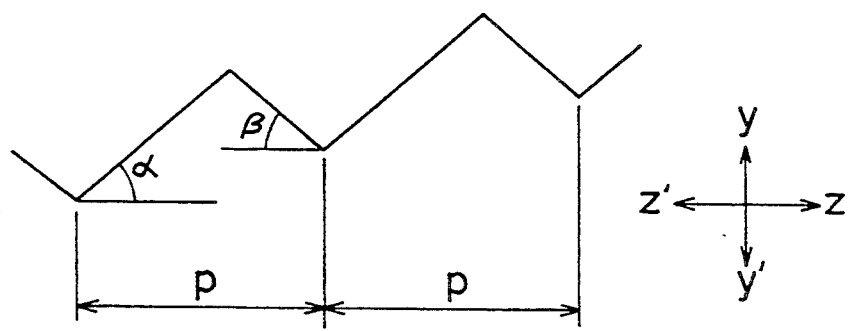
FIG. 10 is an enlarged view of portion A in FIG. 9.

FIG. 9 is a plan view of the light-source device of Embodiment 2 (with respect to one half of its symmetrical construction), and FIG. 10 is an enlarged view of portion A in FIG. 9.

Figure 11:
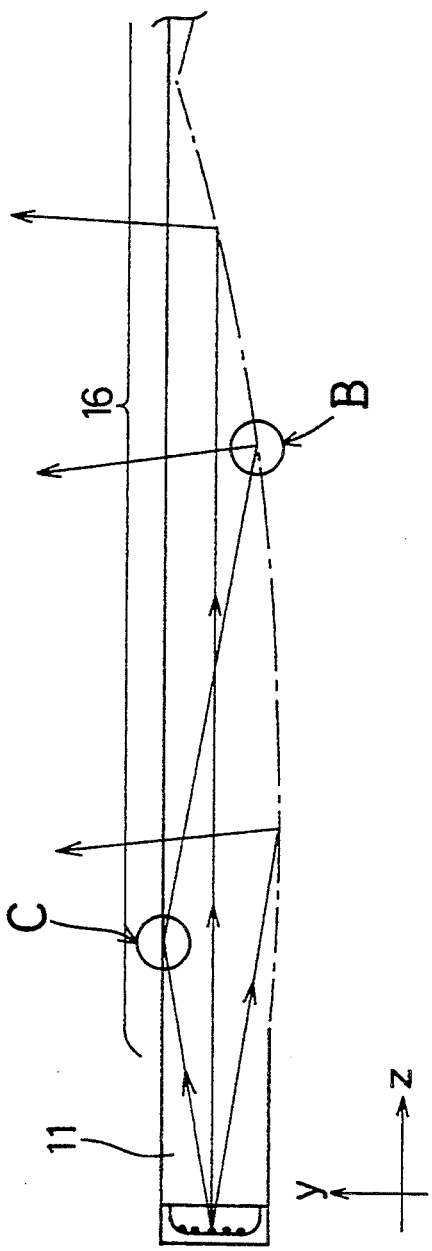
FIG. 11 is a view for explaining the optical path in the embodiment shown in FIG. 7.
Figure 12:
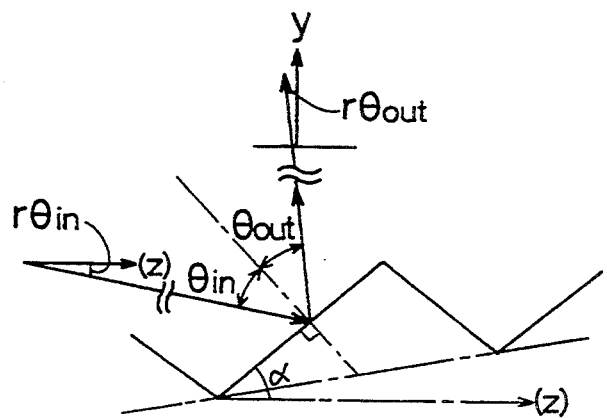
FIG. 12 is an enlarged view of portion B in FIG. 11.
Figure 13:
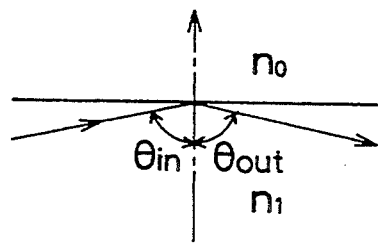
FIG. 13 is an enlarged view of portion C in FIG. 11.

FIG. 11 is a plan view showing an optical path leading from the Embodiment 2 light-source device to light exit surface (with respect to one half of the symmetrical construction of the device); FIG. 12 is an enlarged view of portion B in FIG. 11; and FIG. 13 is an enlarged view of portion C in FIG. 11.

In this embodiment, as FIG. 7 shows, light sources a are provided at opposite sides of an acrylic resin-made substrate 11.

Figure 15:
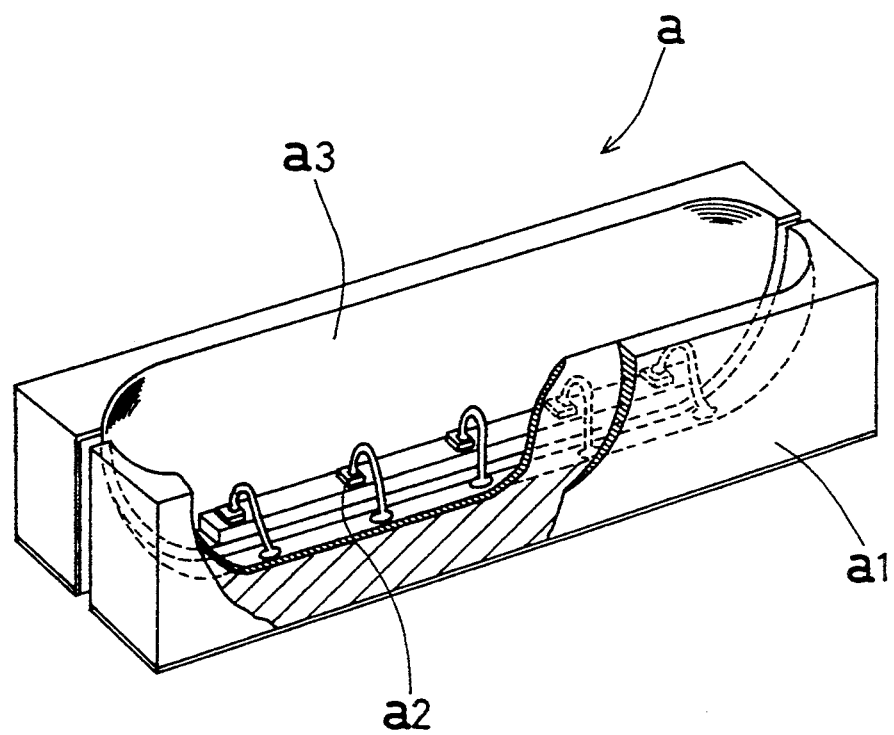
FIG. 15 is an enlarged perspective view showing parts in FIG. 7.

The light sources a in FIG. 7 are each similar in construction to the Embodiment 1 light source, as may be seen from FIG. 15.

While, in Embodiment 1, 36 light-emitting diode chips are arranged on a substrate having a length of 270 mm, each light source in Embodiment 2, as shown in FIG. 15, comprises a 50 mm long substrate a1, 5 light-emitting diode chips a2 arranged thereon, and an epoxy resin element a3 having a planar surface and no lens-form convex portion. The light source a is mounted so that the light-emitting side thereof is in close contact with one side of the substrate 11. Shown by 17 is a resistance element corresponding to the resistance 7 in FIG. 4. Numeral 8 designates a feed connector, and 9 designates a leader.

The surface of the light-pervious substrate 11 is of smooth surface construction, and throughout the surface the percentage of incident light that may contribute to light scattering is limited to less than 1%.

Some part of a side of the light-pervious substrate 11 (hereinafter to be referred to as "optical coupling element"), which is designated by 12, is serrated as shown in FIG. 12. In the present embodiment, as illustrated in FIG. 10 the inclination of serrated edge face of the optical coupling element is standardized at a predetermined angle within the angle ranges of $\alpha = 34$–$42$ degrees and $\beta = 0$–$90$ degrees relative to Z axis.

The serrated surface of the optical coupling element, as shown in FIG. 9, has a length of 10 mm to 20 mm in the direction of Z axis and is divided into small regions as designated by f1 to f9 so that the surface inclination of the optical coupling element at these regions, relative to Z axis, is first decreased at a gradient of more than $-1/20$ mm but not more than $+7/20$ mm and then becomes gradually steep, when viewed from the light-source a side and toward the middle of the substrate (line C—C' in FIG. 9).

These configurational features of the light-pervious substrate are integrally made into the shape by injection molding.

The entire surface area of the serrated optical-coupling element 12, and the upper and lower sides of the light-pervious substrate 11 (portions shown by R in FIG. 9), over an area of 6 mm from each of the substrate ends to which light source a is mounted, have a reflector film formed thereon by aluminum sputtering, the reflector film providing a specular surface having a reflectance of the order of 0.87.

Operation of the arrangement of the present embodiment will be described with reference to the drawings.

A large part of light emitted from light source a is introduced into the interior of the light-pervious substrate 11 as shown in FIG. 11.

In the present embodiment, the refractive index of the acrylic resin material forming the light-pervious substrate 11 is about 1.49%, and the critical angle at which total reflection occurs when light becomes incident from within the substrate on the boundary between the substrate and the atmosphere is 42.3 degrees. Therefore, light rays that have entered the interior of the light-pervious substrate 11 at an angle of not more than 47.7 degrees (90–42.3 degrees) relative to the optical axis (direction of Z axis) are all subject to internal total reflection at upper and lower, and both side surfaces of the light-pervious substrate 11 which are parallel to Z axis.

The quantity of light emitted from the light source a in the present embodiment within an angle range of $\pm 47$ degrees relative to the emission optical axis of the light source is more than about 70% of the total quantity of light emission from the source, and a larger part of the light rays emitted from the light source is confined within the interior of the light-pervious substrate t1 by total reflection at the upper, lower and side surfaces of the substrate 11.

Light rays incident on the light-pervious substrate 11, as FIG. 11 illustrates, will impinge upon the serrated face of the optical coupling element 12 on the surface of the substrate 11, immediately after their entry into the substrate or after repetition of the process of total reflection at the upper, lower and side surfaces of the substrate.

When the critical angle of substrate surfaces and maximum gradient of the optical coupling element 12 (7/20 mm) are considered, the angle of incidence of light upon the optical coupling element 12 is within the range of $+47.7$ to $-19.3$ degrees relative to Z axis. Since the angle $\alpha$ of the serrated edge face of the optical coupling element relative to Z axis is set at 34 to 42 degrees as illustrated in FIG. 12, light rays reflected from that face according to the reflectance (0.87) will become incident upon a light output surface 16 provided in parallel to Z axis within an incidence angle range of $-41.7$ to $+41.3$ degrees.

Since the critical angle at the light output surface 16 is $\pm 42.3$ degrees, a larger part of the light reflected from the serrated edge face of the optical coupling element 12 is directed outward from the light-pervious substrate 11 without being subject to total reflection at the light output surface 16.

The envelope configuration of the serrated edge face of the optical coupling element 12 is such that, as FIG. 11 illustrates, the gradient of the element is varied relative to light rays incident from the light source a side so as to permit a change in the area of serrated edge face of the optical coupling element 12 per unit length thereof in the direction of Z axis. The rate of such gradient change is such that in proportion as the quantity of light emitted from the light source a and incident on the optical coupling element 12 becomes exponentially lowered as the light advances away from the light source, the gradient of the optical coupling element 12 will become exponentially steeper so as to permit an exponential increase in the area of reflecting surface per unit length of the element.

In the vicinity of light source a, for further adjustment of the quantity of light, the surface on which the optical coupling element is formed is inclined in a direction away from the light source, that is, toward the middle of the substrate.

Figure 14:
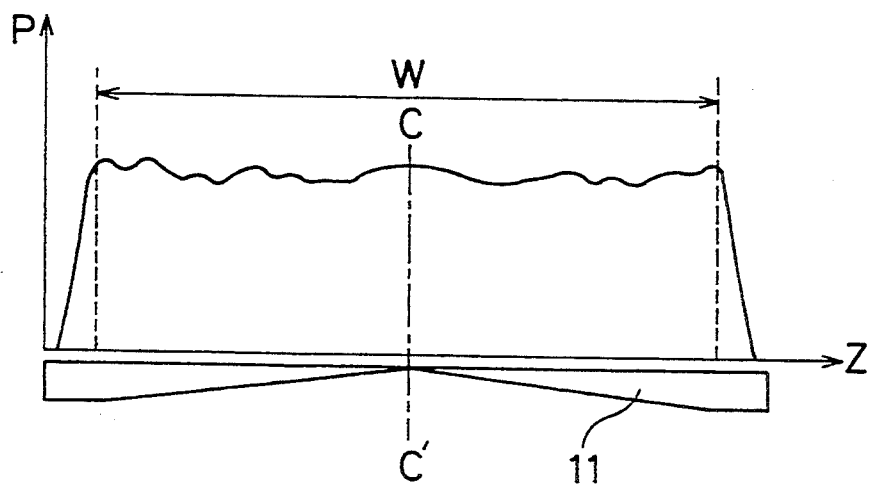
FIG. 14 is an explanatory view showing the luminance distribution in the direction of Z axis at a position 5 mm above the light output plane in Embodiment 2.

In this manner, the quantity of light output from the light output surface 16 of the light-pervious substrate 11 is uniformly distributed throughout almost whole area W with respect to the Z axis direction. FIG. 14 shows one example of light output distribution at a position 5 mm above the plane of light output in the present embodiment.

Light rays directed outward from the light output surface 16 of the substrate 11 are focused onto a linear field 14, i.e., illumination subject, by a plastic-made transparent cylindrical lens 13 disposed in front of the output surface 16.

This cylindrical lens 13 is formed integrally with a frame 15 for fixing the light-pervious substrate 11 in position to enable focusing of light rays projected from the light-pervious substrate 11 onto the subject field 14 for illumination, as shown in FIG. 8. In FIG. 7, the frame 15 is omitted, the lens 13 only being shown.

As may be seen from the description of Embodiment 2, a larger part of the light emitted from the light source comprising a light-emitting semiconductor element is introduced into the interior of the light-pervious substrate and, after frequent repetition of the process of reflection at interior surfaces of the substrate, light rays are output through the optical coupling element which has desired light deflecting characteristics. Therefore, in the case where a plurality of light-emitting elements are employed as the light source, light rays emitted from individual light-emitting elements are spatially mixed within the substrate, which results in considerable betterment in the effect of luminance variations between individual light-emitting elements upon spatial luminance distribution in the subject field being illuminated.

By virtue of such functional merits, the line illumination unit of Embodiment 2 eliminates the necessity of separate adjustment with respect to individual light-emitting elements for correcting output variations among the plurality of light-emitting elements, which adjustment has been required in the past. In addition, it is no longer necessary to effect diffusion of light at the collector lens level as a countermeasure against possible decrease in illuminance (ripple) at gap positions between individual light-emitting elements, more efficient utilization of light being thus possible.

Another advantage of the embodiment is that a light-emitting element unit equipped with a package including a concave mirror for reflecting output light in a specified direction is employed as a light-source, which fact enables highly efficient light coupling to the light-pervious substrate and thus provides for improvement in the utilization of light.

Furthermore, the spatial intensity distribution of output light at output surfaces of the substrate can be suitably designed within a certain range by properly designing the configuration of the light-pervious substrate and the specification of the light coupling element on the substrate. Therefore, it is possible to provide comparatively easily line illumination units having given optical output distribution characteristics, as well as line illumination units having uniform output characteristics. It is thus possible to develop finer-spun specifications better suited for a variety of uses.

EMBODIMENT 3

Figure 16:
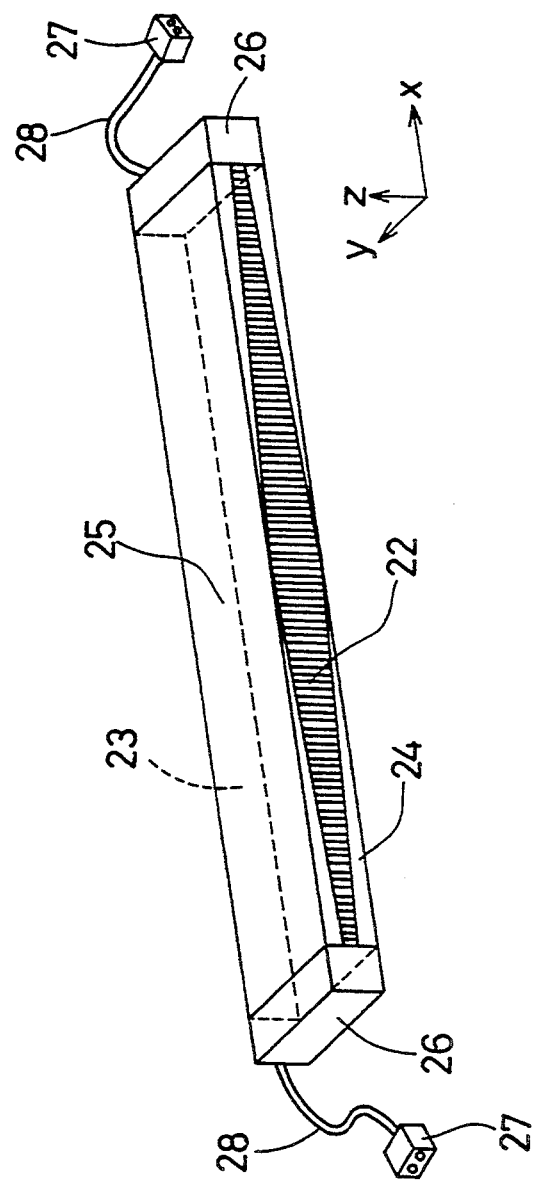
FIG. 16 is a perspective view of a light-source device representing Embodiment 3 of the invention.
Figure 17:
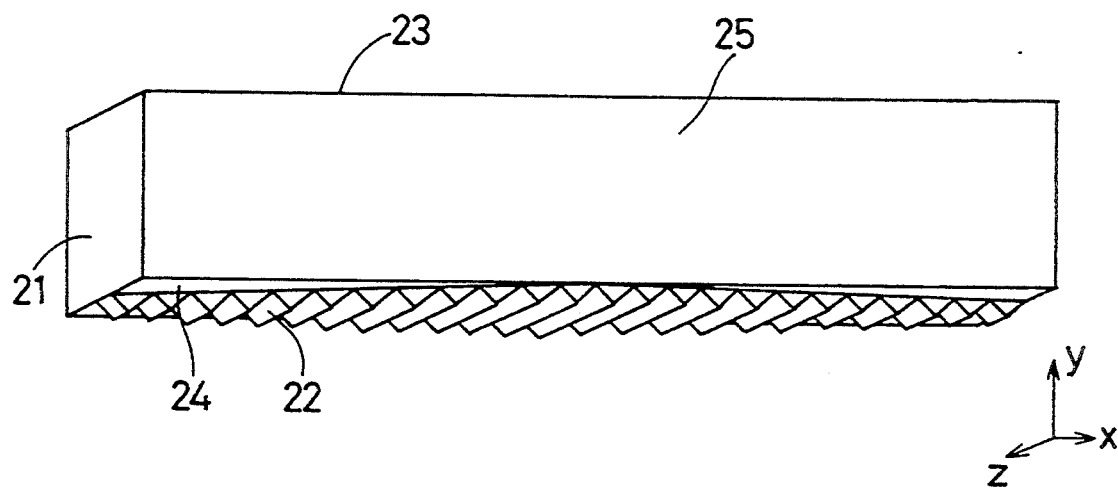
FIG. 17 is a perspective view showing parts in FIG. 16.
Figure 18:
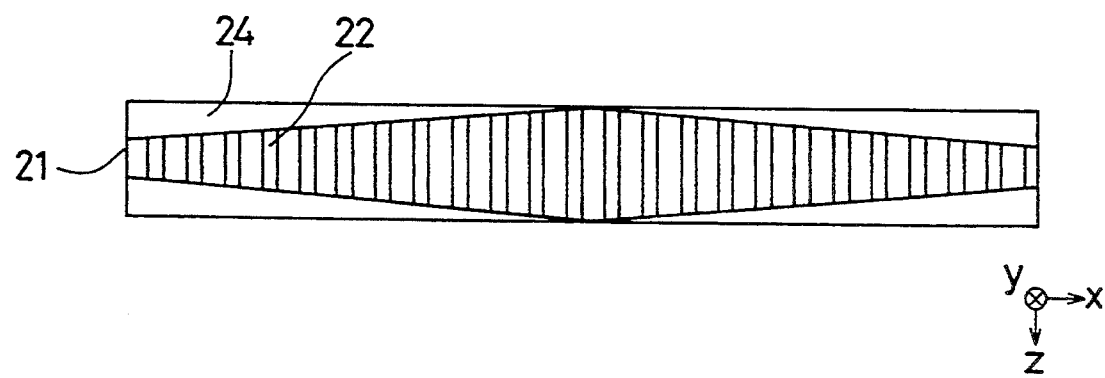
FIG. 18 is a fragmentary plan view of the arrangement shown in FIG. 17.
Figure 19:
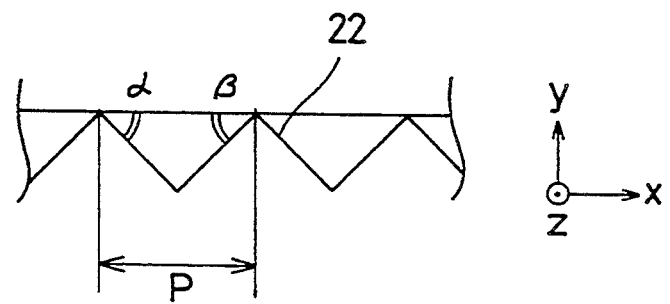
FIG. 19 is a fragmentary enlarged view of the arrangement shown in FIG. 17.
Figure 20:
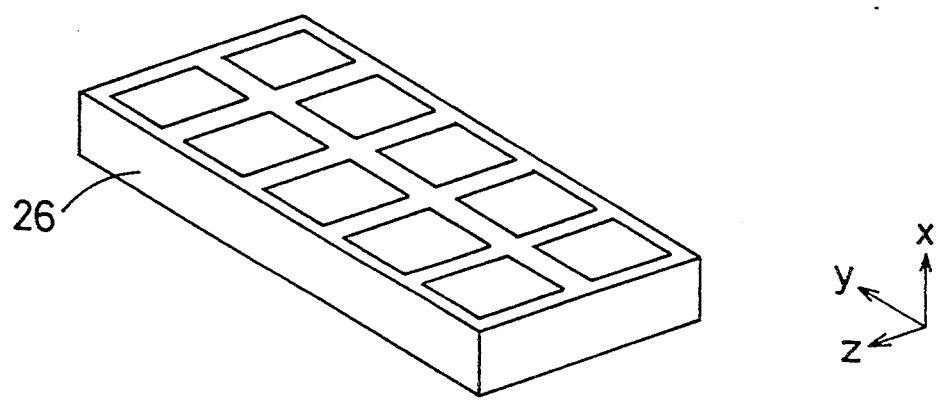
FIG. 20 is a perspective view of the light source employed in the light-source device of Embodiment 3.
Figure 21:
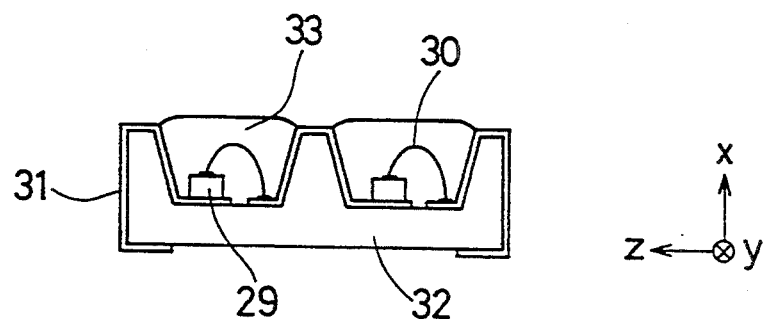
FIG. 21 is a fragmentary sectional view of the arrangement in FIG. 20.
Figure 22:
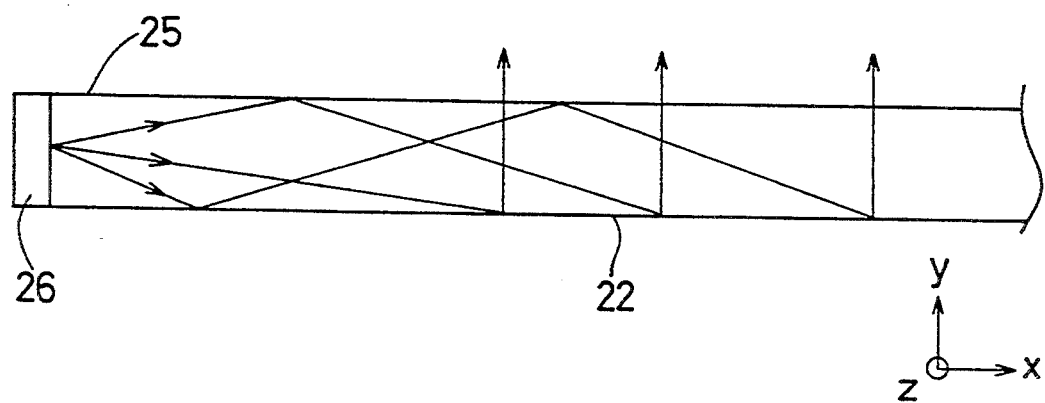
FIG. 22 is an explanatory view showing an optical path in the light-source device of Embodiment 3.
Figure 23:
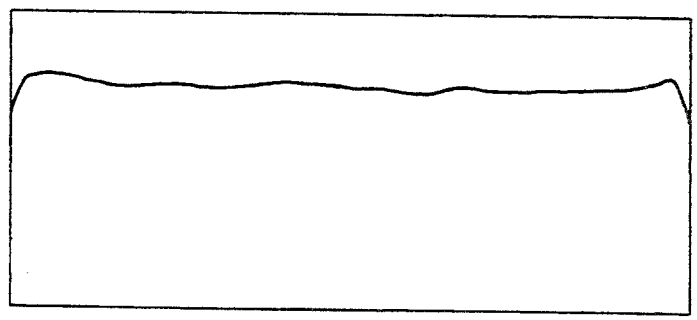
FIG. 23 is an illuminance distribution curve with respect to the light-source device of Embodiment 3.

FIG. 16 is a perspective view of a light-source device representing Embodiment 3 of the invention; FIG. 17 is a perspective view showing parts in FIG. 16; FIG. 18 is a plan view showing parts in FIG. 17; FIG. 19 is an enlarged view showing parts in FIG. 17; FIG. 20 is a perspective view of a light source employed in the light-source device of Embodiment 3; FIG. 21 is a sectional view showing parts in FIG. 20; FIG. 22 is an explanatory view showing an optical path in the Embodiment 3 light-source device; and FIG. 23 is a luminance distribution curve with respect to the Embodiment 3 light-source device.

In the light-source device of this embodiment, light sources 26 are provided at opposite ends of an acrylic resin-made substrate 25 of rectangular shape, as shown in FIG. 16.

Each light source 26 of the light-source device shown in FIG. 16 comprises a resin-made case 32 having electrical insulation properties, and a plurality of light-emitting diodes 29 (ten in number in the present embodiment) packaged in the case, and a metal film 31 formed on the surface of the resin case 32 which constitutes a wiring pattern, the metal film being electrically connected to individual light-emitting diodes 29. The light source 26 is mounted so that its light-emitting side in contact with one end 21 of the substrate 25 (FIG. 17).

In Embodiment 3, the length of the substrate 25 shown in FIG. 17 is 270 mm in the longitudinal direction (X direction) and the size of the end 21 to which the light source is mounted is 10 mm in Y direction and 4 mm in Z direction.

The upper surface of the light-pervious substrate 25 is wholly of smooth construction, and on all surfaces of the substrate, the percentage of incident light that contributes to light scattering is limited to less than 1%.

A portion 22 of one side of the light-pervious substrate 5 (hereinafter referred to as optical coupling element) is serrated as illustrated in FIG. 19. In this embodiment, the inclination of the serrated edge face of the optical coupling element 22 is standardized at a predetermined angle within an angular range of $\alpha = 35$ to 45 degrees and $\beta = 35$ to 45 degrees relative to X axis. The pitch of serration is set at a value of p=less than 1 mm.

The surface formed with such serration, as FIG. 18 shows, comprises an optical coupling element 22 and flat 24. The optical coupling element 22 is of such arrangement that, when viewed in the longitudinal direction (X direction), the area per unit length of its reflective surface becomes larger as the surface is positionally more distant from the one end to which a light source is mounted. It is to be noted, however, that in order to provide illumination of uniform intensity at the subject illumination field, the areas of individual reflective surfaces are set so that the sum of quantities of light incident upon one reflective surface will be constant with respect to all reflective surfaces.

The light-pervious substrate 25, being of such construction as above described, is integrally fabricated by injection molding from a resin material, such as acrylic resin. The serrated surface of the optical coupling element 22 has a reflective film laid thereon by aluminum sputtering which provides a mirror surface having a reflectance of the order of 0.87.

Operation of the embodiment will be described with reference to the relevant drawings.

A larger part of light emitted from each of the light sources 26 mounted to the light-pervious substrate 25 is introduced into the interior of the substrate 25, as shown in FIG. 22.

In the present embodiment, the acrylic resin material from which the light-pervious substrate 25 is formed has a refractive index of about 1.49, and when light becomes incident from the interior of the substrate upon the boundary between the substrate and the atmosphere, the critical angle at which total reflection will occur is 42.3 degrees. Therefore, light rays entering the interior of the light-pervious substrate 25 at an angle of not more than 47.7 degrees (90–42.3 degrees) are all subject to total reflection at upper, lower and side surfaces of the substrate 25 which are parallel to X axis.

The quantity of light projected within the angle range of ±47 degrees relative to the optical axis of a light beam emitted from the light source 26 used in the embodiment corresponds to more than about 60% of total quantity of light emission, and thus a larger part of light rays emitted from the light source is confined within the interior of the substrate through total reflection from the surface of the light-pervious substrate 5 at upper, lower and side surfaces thereof.

Light rays incident on the light-pervious substrate 25 strike directly, or after repeated process of total reflection at upper, lower and side surfaces of the substrate, against the serrated surface of the optical coupling element 22 formed on the surface of the substrate 25, as illustrated in FIG. 22.

Since the critical angle on the light output surface 23 is ±42.3 degrees, a larger part of light beams reflected from the serrated surface of the optical coupling element 22 is directed outward from the light-pervious substrate 25 without being subject to total reflection from the light output surface 23.

In this way, the quantity of light output from the light output surface 23 of the light-pervious substrate 25 is uniformly distributed throughout the entire region as viewed in the direction of X axis. FIG. 23 shows an example of light output distribution over the light output plane in the present embodiment.

As may be understood from the above description of Embodiment 3, a larger part of light emitted from the light source which comprises a semiconductor light-emitting element, after the light is introduced into the interior of the light-pervious substrate, is repetitively subjected to the process of reflection from interior surfaces of the substrate and is then directed outward via the optical coupling element which has given light deflection characteristics. Therefore, even where a plurality of light-emitting elements are employed as the light source, light rays emitted from respective light-emitting elements are spatially mixed within the substrate, and thus the effect of luminance variations, if any, among individual light-emitting elements upon the spatial luminance distribution over the area being illuminated can be substantially improved.

By virtue of such functional characteristics, the light-source device of Embodiment 3 eliminates the necessity of making adjustment against output variations among the plural light-emitting elements separately with respect to individual light-emitting elements, which adjustment has been required with conventional light-source devices. Further, it is no longer necessary to resort to the practice of light diffusion with the collector lens as countermeasures against a decrease in illuminance (ripple) at gaps between individual light-emitting elements, it being thus possible to achieve more efficient light utilization.

EMBODIMENT 4

Figure 24:
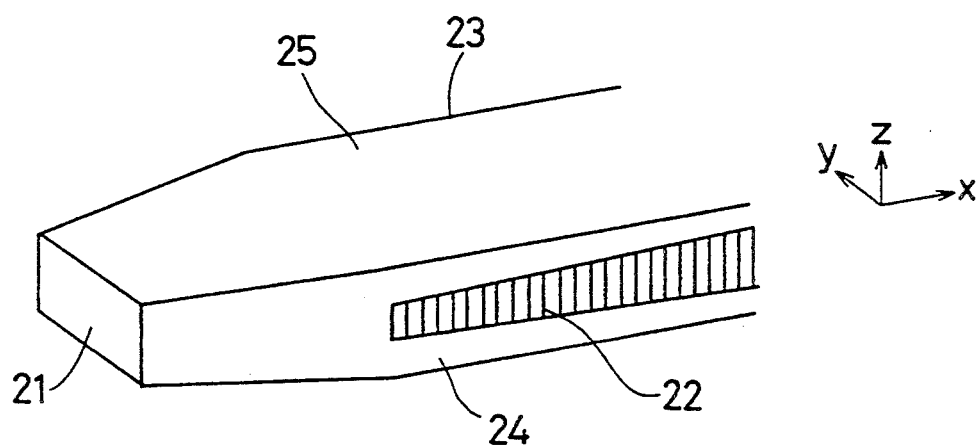
FIG. 24 is an enlarged view showing a portion of the light-source device of Embodiment 4 to which the light source is mounted.
Figure 25:
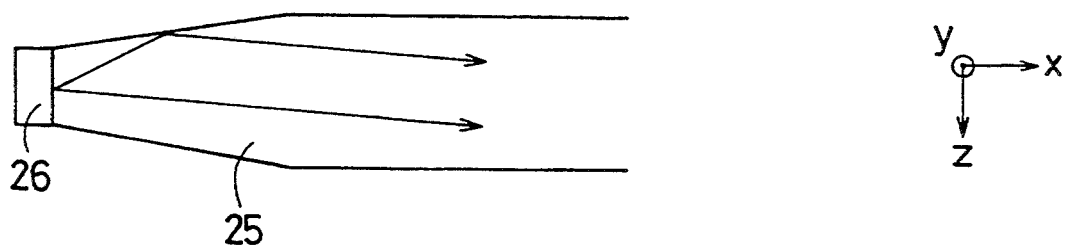
FIG. 25 is a fragmentary view explanatory of an optical path in Embodiment 4.

FIG. 24 is an enlarged view showing a portion of a light-source device representing Embodiment 4 of the invention to which is mounted a light source. FIG. 25 is an explanatory view showing an optical path in that embodiment.

FIG. 26 is a diagrammatic representation showing directional characteristics of light rays from a light output plane, FIG. 26 (a) showing directional characteristics of output rays relative to Z axis in Embodiment 3, FIG. 26 (b) showing directional characteristics of output rays relative to Z axis in Embodiment 4.

Embodiment 4 is different from Embodiment 3 in that one end 21 to which the light source is mounted is configured to be reverse-tapered when viewed from the light-source mount side, but in other respects it is same as Embodiment 3.

Operation of the Embodiment 4 device will be described with reference to the drawings.

As FIG. 25 illustrates, some of light rays emitted from the light source 26 which has gone astray largely from the optical axis (X axis) is caused to be reflected from the tapered surface for being oriented along the optical path in its travel. In contrast, a light ray which does not strike on the tapered surface is not so much away from the optical path in its travel. As a result, light beams advancing within the substrate are aligned and directionally better oriented.

The surface of that tapered side which has a normal component perpendicular to Z axis provides improved directional characteristics relative to Y axis for light rays travelling within the interior of the substrate 25, and the surface of that tapered side which has a normal component perpendicular to Y axis provides improved directional characteristics relative to Z axis for light rays travelling within the interior of the substrate 25. All such light rays are reflected from the serrated surface of the optical coupling element and are then directed outward. As such, it is possible to obtain highly directional illumination.

Optical directional characteristics of Embodiment 3 are illustrated in FIG. 26 (a). According to the arrangement of Embodiment 4, as shown in FIG. 24, the light-pervious substrate is tapered and this provides foe enhancement of directional characteristics of illumination from the level of FIG. 26 (a) to the level of FIG. 26 (b).

Because of such functional characteristics, light rays from the light source can be more effectively utilized for illumination of linear fields.

The spatial luminance distribution at the output plane of the substrate with respect to output light rays may be freely determined within a reasonable range by properly designing the configuration of the light-pervious substrate and specification of the optical coupling element on the substrate. Therefore, it is not only possible to provide light-source devices having uniform output characteristics, but also to provide comparatively easily light-source devices having any other optical output distribution characteristics as desired. This no doubt leads to development of particular specifications better suited for a variety of applications.

According to the invention, it is possible to utilize light from the light source (light-emitting element) very effectively for illumination.

Further, where light-emitting elements are employed in plurality as the light source, the intensity of light therefrom can be uniformly distributed.

What is claimed is:

1. A light-source device comprising:
   a light-source including a linear array of light emitting diodes, and
   converting means for converting light emitted from the light-source into one dimension light spread for uniformly illuminating a linear field which is longer than the linear array of light emitting diodes,
   the converting means including a light-pervious multilateral faced flat board including at least three lateral faces, both ends of a first lateral face each being joined with a second and a third lateral face, the light-source being provided adjacent to the first lateral face of the flat board for introduction of light into the flat board so that the incoming light is caused to be reflected from the second lateral face and directed from the flat board to the linear field through the third lateral face, the second lateral face having a reflection area with a serrated sectional configuration, the linear array of light emitting diodes being arranged orthogonally to the third lateral face.

2. A light-source device of claim 1, in which the light source comprises a substrate having a recess formed in the surface thereof, light-emitting diodes arranged on the bottom of the recess, and a conductive reflective film formed on the surface of the recess, the light-emitting diodes being electrically connected to an external power source via the conductive reflective film.

3. A light-source device of claim 2, in which the conductive reflective film is divided into two segments, the anodes and cathodes of the diodes being connected to the external power source via one of the segments and the other segment, respectively.

4. A light-source device of claim 1, in which the reflection area is made larger in proportion as the area is more distant from the light-source.

5. A light-source device of claim 4, in which the light source comprises a substrate having a recess formed in the surface thereof, light-emitting diodes arranged on the bottom of the recess, and a conductive reflective film formed on the surface of the recess, the light-emitting diodes being electrically connected to an external power source via the conductive reflective film.

6. A light-source device of claim 5, in which the conductive reflective film is divided into two segments, the anodes and cathodes of the diodes being connected to the external power source via one of the segments and the other segment, respectively.

7. A light-source device of claim 1 wherein the light-pervious flat board is reverse-tapered from the first lateral face to the second and third lateral faces of the light-pervious flat board by fourth and fifth lateral faces of the light-pervious flat board.

8. A light-source device of claim 7, in which the light source comprises a substrate having a recess formed in the surface thereof, light-emitting diodes arranged on the bottom of the recess, and a conductive reflective film formed on the surface of the recess, the light-emitting diodes being electrically connected to an external power source via the conductive reflective film.

9. A light-source device of claim 8, in which the conductive reflective film is divided into two segments, the anodes and cathodes of the diodes being connected to the external power source via one of the segments and the other segment, respectively.

10. A light-source device of claim 4 wherein the light-pervious flat board is reverse-tapered from the first lateral face to the second and third lateral faces of the light-pervious flat board and by fourth and fifth lateral faces of the light-pervious flat board.

11. A light-source device of claim 10, in which the light source comprises a substrate having a recess formed in the surface thereof, light-emitting diodes arranged on the bottom of the recess, and a conductive reflective film formed on the surface of the recess, the light-emitting diodes being electrically connected to an external power source via the conductive reflective film.

12. A light-source device of claim 11, in which the conductive reflective film is divided into two segments, the anodes and cathodes of the diodes being connected to the external power source via one of the segments and the other segment, respectively.

13. A light-source device of claim 1, in which the second lateral face comprises a plurality of lateral faces which are different from each other in angular orientation with respect to the first lateral face.

14. A light-source device of claim 1 further comprising a second light-source, the flat board having a sixth lateral face parallel to the first lateral face, the second light-source being optically connected to the sixth lateral face.

15. A light-source device of claim 14, in which the flat board is rectangular in cross section.

16. A light-source device of claim 1, in which the reflection area has a metal reflector film formed thereon.

17. A light-source device comprising:
  a substrate of electrical insulating material having an elongated recess formed in a surface thereof;
  a conductive reflective film on a surface of the recess, said film being separated into a plurality of electrically separate portions within the recess;
  a linear array of light emitting diodes comprising end diodes and intermediate diodes, each of said diodes being conductively mounted on one of the separate portions of said film on the bottom surface of said recess;
  each of said intermediate diodes including a bonding wire electrically connecting the respective diode to an adjacent separate portion of said film in said recess;
  each of said end diodes being connected to an electrical power source for supplying electrical energy to said linear array of light emitting diodes; and
  a light pervious material formed in said recess to cover said diodes.

18. A light-source device as in claim 17 wherein said film formed on the surface of the recess when viewed in cross section form a parabolic reflecting surface.

19. A light-source device as in claim 18 wherein the plurality of separate portions of said film are formed to provide a reflective surface around each of said light emitting diodes.

20. A light-source device as in claim 17 wherein said light pervious material formed in said recess extends out of said recess to form a cylindrical lens to form a linear field on an illumination objection.

* * * * *